(12) United States Patent
Grant (10) Patent No.: US 9,023,133 B2
(45) Date of Patent: May 5, 2015

(54) METHOD OF PUMPING GAS (75) Inventor: Robert Bruce Grant, Steyning (GB)

(73) Assignee: Edwards Limited, Crawley, West Sussex (GB)

( * ) Notice: Subject to any disclaimer, the term of this patent is extended or adjusted under 35 U.S.C. 154(b) by 1038 days.

(21) Appl. No.: 12/310,742

(22) PCT Filed: Aug. 2, 2007

(86) PCT No.: PCT/GB2007/050465
§ 371 (c)(1),
(2), (4) Date: Aug. 12, 2010

(87) PCT Pub. No.: WO2008/029176
PCT Pub. Date: Mar. 13, 2008

(65) Prior Publication Data
US 2011/0020142 A1 Jan. 27, 2011

(30) Foreign Application Priority Data
Sep. 6, 2006 (GB) .................................. 0617498.1

(51) Int. Cl.
*B01D 53/22* (2006.01)
*C23C 16/44* (2006.01)

(52) U.S. Cl.
CPC ............ *C23C 16/4412* (2013.01); *B01D 53/22* (2013.01); *B01D 2257/104* (2013.01); *B01D 2257/70* (2013.01)

(58) Field of Classification Search
CPC ....................................................... B01D 53/22
USPC ........................... 204/260, 265, 266, 272, 295
See application file for complete search history.

(56) References Cited

U.S. PATENT DOCUMENTS

| 4,707,342 A | 11/1987 | Iniotakis et al. | |
| 5,306,411 A * | 4/1994 | Mazanec et al. | .............. 204/265 |

(Continued)

FOREIGN PATENT DOCUMENTS

| EP | 0 778 069 A1 | 6/1997 |
| EP | 0 887 099 A2 | 12/1998 |

(Continued)

OTHER PUBLICATIONS

United Kingdom Search Report of Application No. GB 0617498.8 mailed Jan. 29, 2007; Claims searched: 1-48; Date of Search: Jan. 26, 2007.

(Continued)

*Primary Examiner* — Keith Hendricks
*Assistant Examiner* — Salil Jain
(74) *Attorney, Agent, or Firm* — Westman, Champlin & Koehler, P.A.

(57) ABSTRACT

A vacuum pumping arrangement is described for pumping a gas stream containing hydrogen or other hydrogen-containing gas. The arrangement comprises a pumping mechanism for receiving the gas stream and exhausting a pumped gas stream at a sub-atmospheric pressure, and, downstream from the pumping mechanism, an ionic conducting membrane having one side exposed to the pumped gas stream and another side exposed to oxygen or other source of oxygen. In one example, the membrane is permeable to hydrogen, which permeates across the membrane to react with oxygen adsorbed on the other surface of the membrane. In another example, the membrane is permeable to oxygen anions, which permeate across the membrane to react with hydrogen within the gas stream.

18 Claims, 2 Drawing Sheets

(56) References Cited

U.S. PATENT DOCUMENTS

| | | | |
|---|---|---|---|
| 5,449,848 A | | 9/1995 | Itoh |
| 5,935,395 A | * | 8/1999 | Ouellet et al. ........... 204/298.07 |
| 6,791,097 B2 | * | 9/2004 | Scheuer et al. .......... 250/492.21 |
| 7,090,741 B2 | * | 8/2006 | Narushima et al. ...... 156/345.26 |
| 2009/0321271 A1 | * | 12/2009 | Grant ........................... 205/338 |

FOREIGN PATENT DOCUMENTS

| | | |
|---|---|---|
| EP | 1 459 800 A2 | 9/2004 |
| EP | 1 553 303 A2 | 7/2005 |
| WO | WO 98/02379 | 1/1998 |
| WO | WO 00/29093 | 5/2000 |
| WO | WO 2006/008521 A1 | 1/2006 |

OTHER PUBLICATIONS

PCT Notification of Transmittal of the International Search Report and the Written Opinion of the International Searching Authority, or the Declaration of International Application No. PCT/GB2007/050465; Date of mailing: Jan. 21, 2008.

PCT International Search Report of International Application No. PCT/GB2007/050465; Date of mailing of the International Search Report: Jan. 21, 2008.

PCT Written Opinion of the International Searching Authority of International Application No. PCT/GB20007/050465; Date of mailing: Jan. 21, 2008.

Prosecution history from corresponding European Application No. 07766477.9 including: Communication dated Jan. 14, 2011; Communication dated Nov. 26, 2012; Response dated Oct. 24, 2011.

* cited by examiner

METHOD OF PUMPING GAS

FIELD OF THE INVENTION

The present invention relates to a method of, and apparatus for, pumping a gas stream containing hydrogen or other hydrogen-containing gas.

BACKGROUND OF THE INVENTION

A primary step in the fabrication of semiconductor devices is the formation of a thin film on a semiconductor substrate by chemical reaction of vapour precursors. One known technique for depositing a thin film on a substrate is chemical vapour deposition (CVD). In this technique, process gases are supplied to an evacuated process enclosure housing the substrate and react to form a thin film over the surface of the substrate. An example of a CVD process used to deposit an aluminium layer on a substrate is MOCVD (metal organic chemical vapour deposition), in which an organoaluminium precursor is supplied to the process enclosure from a bubbler, the precursor being entrained within a carrier gas, such as nitrogen or argon, conveyed to the bubbler. A hydrogen reducing gas is also supplied to the process enclosure for reducing the precursor. The process enclosure is evacuated, and heated to a deposition temperature, generally less than 500° C., at which the precursor decomposes and aluminium is deposited on to the substrate.

Another known technique for depositing a thin film on a substrate is a physical vapour deposition (PVD) process, in which the material to be deposited is converted into a vapour. This vapour is transported across an evacuated process enclosure from its source to the substrate, where the vapour condenses to form a thin film on the substrate.

In such deposition processes, the residence time of the deposition gases in the processing enclosure is relatively short, and only a small proportion of the gas supplied to the enclosure is consumed during the deposition process. Consequently, much of the deposition gas supplied to the process enclosure is exhausted from the enclosure together with by-products from the deposition process, and conveyed to a secondary vacuum pump used to evacuate the process enclosure. A turbomolecular pump, capable of evacuating the process enclosure to a low pressure, is often used as the secondary pump.

A process tool usually comprises a plurality of process enclosures, in which similar or different processes may be conducted at any given time. For example, in addition to one or more deposition enclosures, the process tool may comprise one or more etch enclosures within which features are etched within the substrate and/or within the thin film deposited on the substrate. Separate secondary pumps are generally used to evacuate the enclosures. In order to reduce the complexity, footprint and power requirements of the overall pumping arrangement while improving reliability and costs associated with the pumping arrangement, it is preferable to provide a single primary pump to back a number of separate secondary pumps.

Light gases, that is, gases such as hydrogen having a low relative molecular mass, are seen as contaminants for a number of deposition processes. For example trace quantities of these gases in the process enclosure in which a physical vapour deposition (PVD) is being performed can have a negative impact on the properties of the layer being deposited on the substrate.

There are a number of potential sources of such contamination, including cracking of moisture, and contamination of the gases supplied to the process enclosure. As another example, hydrogen that is being pumped from a first process enclosure by one secondary vacuum pump can migrate backwards through the secondary vacuum pump used to evacuate a second process enclosure when a single primary pump is used to back both secondary vacuum pumps, and particularly when the secondary pumps employ turbomolecular pumping mechanisms.

SUMMARY OF THE INVENTION

In a first aspect, the present invention provides a method of pumping a gas stream containing a hydrogen-containing gas, comprising the steps of conveying the gas stream through a vacuum pumping mechanism, subsequently conveying the gas stream at a sub-atmospheric pressure to one side of a membrane permeable to a selected one of hydrogen ions and oxygen ions, and exposing the other side of the membrane to a gaseous source of oxygen ions, so that ions from one of the hydrogen-containing gas and the oxygen source permeate across the membrane to react with the other of the hydrogen-containing gas and the oxygen source.

In another aspect of the present invention, oxygen ions from the oxygen source permeate across the membrane to react with the hydrogen-containing gas. Therefore, in a second aspect the present invention provides a method of pumping a gas stream containing a hydrogen-containing gas, comprising the steps of conveying the gas stream through a vacuum pumping mechanism, subsequently conveying the gas stream at a sub-atmospheric pressure to one side of an oxygen anion conducting membrane, and exposing the other side of the membrane to a gaseous source of oxygen ions, so that oxygen ions from the oxygen source permeate across the membrane to react with the hydrogen-containing gas.

In another aspect of the present invention, hydrogen ions from the hydrogen-containing gas permeate across the membrane to react with the oxygen source. Therefore, in a third aspect the present invention provides a method of pumping a gas stream containing a hydrogen-containing gas, comprising the steps of conveying the gas stream through a vacuum pumping mechanism, subsequently conveying the gas stream at a sub-atmospheric pressure to one side of a hydrogen permeable membrane, and exposing the other side of the membrane to a gas for reacting with hydrogen which has permeated across the membrane.

In a fourth aspect, the present invention provides a vacuum pumping arrangement for pumping a gas stream containing a hydrogen-containing gas, the arrangement comprising a pumping mechanism for receiving the gas stream and exhausting a pumped gas stream at a sub-atmospheric pressure, and, downstream from the pumping mechanism, a membrane permeable to a selected one of hydrogen ions and oxygen ions, the membrane having one side exposed to the pumped gas stream and another side exposed to a gaseous source of oxygen ions.

In a fifth aspect, the present invention provides a vacuum pumping arrangement for pumping a gas stream containing a hydrogen-containing gas, the arrangement comprising a pumping mechanism for receiving the gas stream and exhausting a pumped gas stream at a sub-atmospheric pressure, and, downstream from the pumping mechanism, an oxygen anion conducting membrane having one side exposed to the pumped gas stream and another side exposed to a gaseous source of oxygen ions.

In a sixth aspect, the present invention provides a vacuum pumping arrangement for pumping a gas stream containing a hydrogen-containing gas, the arrangement comprising a pumping mechanism for receiving the gas stream and exhausting a pumped gas stream at a sub-atmospheric pressure, and, downstream from the pumping mechanism, a hydrogen permeable membrane having one side exposed to the pumped gas stream and another side exposed to a gas for reacting with hydrogen which has permeated across the membrane.

BRIEF DESCRIPTION OF THE DRAWINGS

Preferred features of the present invention will now be described with reference to the accompanying drawings, in which.

DETAILED DESCRIPTION OF THE INVENTION

While increasing the compression of the secondary vacuum pump, by adding additional pumping stages to the pumping mechanism, would reduce the backward migration of these contaminants, this would also increase the cost and size of the secondary vacuum pump.

In a first aspect, the present invention provides a method of pumping a gas stream containing a hydrogen-containing gas, comprising the steps of conveying the gas stream through a vacuum pumping mechanism, subsequently conveying the gas stream at a sub-atmospheric pressure to one side of a membrane permeable to a selected one of hydrogen ions and oxygen ions, and exposing the other side of the membrane to a gaseous source of oxygen ions, so that ions from one of the hydrogen-containing gas and the oxygen source permeate across the membrane to react with the other of the hydrogen-containing gas and the oxygen source.

As the membrane can provide pumping of, for example, $H_2$, by the removal of hydrogen from the gas stream, the combination of the pumping mechanism and the membrane can provide improved hydrogen pumping performance with relatively low additional costs.

Alternatively, the pumping mechanism provided upstream from the membrane can be optimised for the pumping of heavier gases. This can enable the number of pumping stages of the pumping mechanism to be relatively small, reducing the cost of the pumping mechanism. While this will decrease the hydrogen pumping performance of the pumping mechanism, the addition, to the exhaust of the pumping mechanism, of a membrane that can effectively pump hydrogen can return the hydrogen pumping performance to at least that of the pumping mechanism prior to the removal of the pumping stages therefrom.

The pumping mechanism can inhibit the back migration of any by-products from the reaction such as $H_2O$, and an unreacted oxygen molecules from migrating backwards to a process enclosure from which the gas stream is drawn by the pumping mechanism.

Furthermore, the presence of the membrane can inhibit the back streaming of $H_2$ and other hydrogen-containing gases through the pumping mechanism when a primary pump is provided in common with the pumping mechanism and another secondary vacuum pump.

The membrane may be connected to the exhaust of the pumping mechanism by attaching a casing housing the membrane to the exhaust flange of a vacuum pump comprising the pumping mechanism, or by incorporating the membrane at least partially within the casing housing the pumping mechanism.

The pumping mechanism preferably comprises a molecular pumping mechanism, and more preferably comprises a turbomolecular pumping mechanism. The pumping mechanism is preferably arranged to exhaust the gas stream to the membrane at a pressure lower than 50 mbar, more preferably at a pressure below 10 mbar. In the event that the membrane is selected so that oxygen anions permeate across the membrane into the sub-atmospheric gas stream, the catastrophic nature of a gas phase chemical reaction between the oxygen anions and the hydrogen-containing gas is relatively low.

In another aspect of the present invention, oxygen ions from the oxygen source permeate across the membrane to react with the hydrogen-containing gas. Therefore, in a second aspect the present invention provides a method of pumping a gas stream containing a hydrogen-containing gas, comprising the steps of conveying the gas stream through a vacuum pumping mechanism, subsequently conveying the gas stream at a sub-atmospheric pressure to one side of an oxygen anion conducting membrane, and exposing the other side of the membrane to a gaseous source of oxygen ions, so that oxygen ions from the oxygen source permeate across the membrane to react with the hydrogen-containing gas.

The membrane may be provided by an ionic conducting membrane such as an yttrium stabilised zirconium or a gadolinium doped ceria oxygen anion conductor. An advantage associated with the use of such a membrane is that a potential difference needs to be applied across the membrane in order to actuate the permeation of oxygen ions through the membrane, otherwise the membrane is impervious to the ions. Thus, in the event of a power failure, transference of oxygen anions to the gas stream is inhibited, thereby avoiding the generation of a potentially explosive atmosphere on one side of the membrane. By controlling the magnitude of the potential difference applied across the membrane, the rate of permeation of the ions can be controlled so that the rate at which the ions enter the gas stream is sufficient to react with substantially all of the hydrogen-containing gas within the gas stream. The absolute magnitude of the current used to drive the oxygen anions across the membrane will generally depend upon the surface area of electrodes located on the sides of the membrane, the partial pressure of the gaseous oxygen source, and the amount of hydrogen-containing gas within the gas stream. The potential difference applied across the membrane can be adjusted in dependence on the output of a sensor used to measure the amount of oxygen present within the gas stream downstream from the membrane. For example, if the sensor detects no oxygen, this can provide an indication that there is insufficient permeation of oxygen anions across the membrane to react with all of the hydrogen-containing gas, and so the potential difference or current density may be increased gradually until the sensor detects that oxygen is present in the gas stream.

Furthermore, since at least one, or in the case of hydrogen all, of the products of the reaction between the hydrogen-containing gas and the oxygen anions are condensable, the size of a vacuum pump located downstream from the membrane can be reduced. For example, each slm of hydrogen contained within the gas stream generates an additional slm of pumping speed when the condensable species such as water vapour are condensed from the gas stream.

The water vapour may be condensed from the gas stream within a condenser located between the membrane and a vacuum pump located downstream from the membrane. Alternatively, this vacuum pump may have a pumping mechanism that exposes the gas stream to water and wherein the water vapour is condensed from the gas stream. Examples of a vacuum pump having such a pumping mechanism include a liquid ring pump and a liquid ejector pump.

As mentioned above, the potential difference can be applied across the membrane using a first electrode on said one side of the membrane and a second electrode on said other side of the membrane, wherein at least one of the electrodes comprises catalytic material, such as platinum or another platinum group metal, to improve the reaction kinetics. For example, providing a catalyst on the side of the membrane exposed to the oxygen source can promote the dissociation of oxygen into oxygen anions, whilst providing a catalyst on the side of the membrane exposed to the gas stream can promote the oxidation of the hydrogen-containing gas.

The oxygen anions may be derived from a gaseous source of oxygen. Atmospheric air may be conveniently used as a gaseous source of oxygen, although other gas compositions can be used.

Means may be provided for controlling the temperature of the membrane. Depending on the nature of the membrane, the membrane may need to be heated to an elevated temperature to have the required degree of conductivity for the oxygen anions. At temperatures below a critical temperature ($T_c$) the material from which the membrane is formed may be non-conducting, but at temperatures above $T_c$ the membrane may become progressively more conductive. A heating mechanism may be conveniently provided, for example about the membrane, or within a tubular membrane, to heat the membrane to the required temperature. Alternatively, the gaseous source of oxygen may be heated to a temperature above $T_c$ before delivery to said other side of the membrane, so that the membrane is heated by the gaseous source of oxygen. For example, the membrane may require heating to a temperature in excess of 300° C., for example to a temperature between 300 and 500° C., to enable oxygen anions to permeate through the membrane.

In another aspect of the present invention, hydrogen ions from the hydrogen-containing gas permeate across the membrane to react with the oxygen source. Therefore, in a third aspect the present invention provides a method of pumping a gas stream containing a hydrogen-containing gas, comprising the steps of conveying the gas stream through a vacuum pumping mechanism, subsequently conveying the gas stream at a sub-atmospheric pressure to one side of a hydrogen permeable membrane, and exposing the other side of the membrane to a gas for reacting with hydrogen which has permeated across the membrane.

In this example, the hydrogen permeable membrane may be provided by a palladium silver alloy or by a palladium film. The membrane may be supported on a porous or nano-porous body. As with the first example, means may be provided for controlling the temperature of the membrane, as depending on the nature of the membrane, the membrane may need to be heated to an elevated temperature to have the required degree of conductivity for the hydrogen ions. At temperatures below a critical temperature ($T_c$) the material from which the membrane is formed may be non-conducting, but at temperatures above $T_c$ the membrane may become progressively more conductive. A heating mechanism may be conveniently provided, for example about the membrane or within a tubular membrane, to heat the membrane to the required temperature. Alternatively, the gas for reacting with the hydrogen ions may be heated to a temperature above $T_c$ before delivery to said other side of the membrane, so that the membrane is heated by this gas. For example, the membrane may require heating to a temperature in excess of 100° C., for example to a temperature between 100 and 300° C., to enable hydrogen ions to permeate through the membrane.

In any of the above examples, the membrane may be in the form of a cylinder. The gas stream may pass through the bore of the cylinder, with the oxygen source conveyed about the outer surface of the cylinder. Means may be provided for generating turbulence in the flow of the gas stream through the cylinder to promote the reaction of the hydrogen ions or hydrogen-containing gas. Alternatively, the bore of the cylinder may be exposed to the oxygen source, with the gas stream impinging upon the outer surface of the cylinder. In order to increase the efficiency of the destruction of the hydrogen-containing gas, a plurality of said cylindrical membranes may be provided in parallel or in series. Alternatively, the membrane may have a plate-like structure.

Features described above in relation to method aspects of the invention are equally applicable to apparatus aspects of the invention, and vice versa.

In a fourth aspect, the present invention provides a vacuum pumping arrangement for pumping a gas stream containing a hydrogen-containing gas, the arrangement comprising a pumping mechanism for receiving the gas stream and exhausting a pumped gas stream at a sub-atmospheric pressure, and, downstream from the pumping mechanism, a membrane permeable to a selected one of hydrogen ions and oxygen ions, the membrane having one side exposed to the pumped gas stream and another side exposed to a gaseous source of oxygen ions.

In a fifth aspect, the present invention provides a vacuum pumping arrangement for pumping a gas stream containing a hydrogen-containing gas, the arrangement comprising a pumping mechanism for receiving the gas stream and exhausting a pumped gas stream at a sub-atmospheric pressure, and, downstream from the pumping mechanism, an oxygen anion conducting membrane having one side exposed to the pumped gas stream and another side exposed to a gaseous source of oxygen ions.

In a sixth aspect, the present invention provides a vacuum pumping arrangement for pumping a gas stream containing a hydrogen-containing gas, the arrangement comprising a pumping mechanism for receiving the gas stream and exhausting a pumped gas stream at a sub-atmospheric pressure, and, downstream from the pumping mechanism, a hydrogen permeable membrane having one side exposed to the pumped gas stream and another side exposed to a gas for reacting with hydrogen which has permeated across the membrane.

Figure 1:
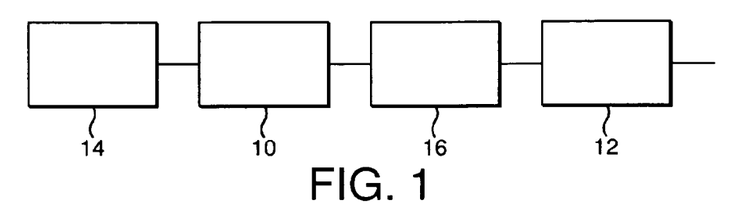
FIG. 1 illustrates a vacuum pumping arrangement for pumping a gas stream.

FIG. 1 illustrates an example of a vacuum pumping arrangement for pumping a gas stream containing a hydrogen-containing gas, such as $H_2$ or a hydrocarbon having the general formula $C_xH_y$. The pumping arrangement comprises a first, or secondary, vacuum pump 10 for receiving the gas stream and exhausting a pumped gas stream to a second, or primary, vacuum pump 12. The secondary vacuum pump 10 may have any type of the pumping mechanism. In this example, the pumping mechanism of the secondary vacuum pump 10 comprises a molecular pumping mechanism, which is preferably a turbomolecular pumping mechanism. This can enable the pumping arrangement to generate a sufficiently low pressure in a process enclosure 14 connected to the inlet of the secondary vacuum pump 10 to enable a deposition process, such as CVD or PVD, to be performed in the process enclosure 14.

The pumped gas stream is exhausted from the first vacuum pump 10 at a sub-atmospheric pressure, for example below 50 mbar. The primary vacuum pump 12 may have any suitable pumping mechanism that receives the pumped gas stream from the secondary vacuum pump 10 and exhaust the gas stream substantially at atmospheric pressure.

A membrane reactor 16 is located between the vacuum pumps 10, 12 for removing at least some of the hydrogen-containing gas from the gas stream. The membrane reactor 16 may be connected to the exhaust of the secondary vacuum pump 10, or it may be at least partially within a casing housing the pumping mechanism of the secondary vacuum pump 10. In overview, the membrane reactor 16 comprises a membrane which is permeable to a selected one of oxygen ions and hydrogen ions. In the first case, oxygen permeates through the membrane into the sub-atmospheric gas stream to react with the hydrogen-containing gas according to the equation (1) below:

$$C_xH_y+(2x+y/2)O_2 \leftrightarrows xCO_2+y/2H_2O+(4x+y)e^- \quad (1)$$

to produce water vapour and, when x≥1, carbon dioxide. In the second case, hydrogen permeates through the membrane from the sub-atmospheric gas stream to react with a gas, such as oxygen, present on the other side of the membrane according to the equation (2) below:

$$H_2+O_2 \leftrightarrows H_2O+2e^- \quad (2)$$

In either case, the water produced from the reaction is conveyed away from the membrane, effectively creating a continuous hydrogen getter pump.

Figure 2:
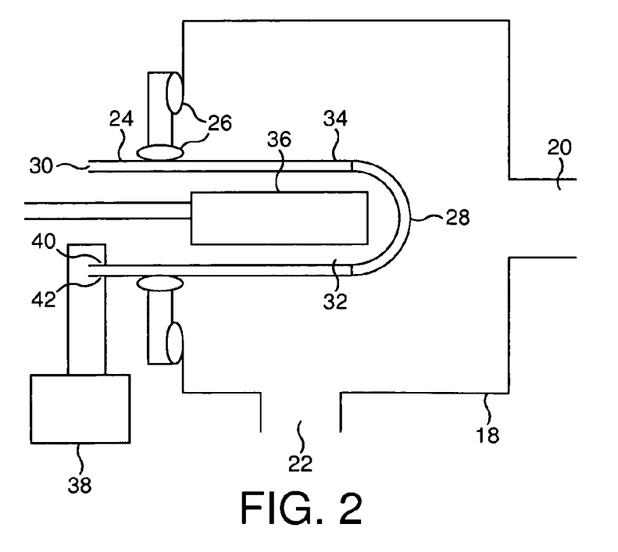
FIG. 2 illustrates one example of a membrane reactor for use in the pumping arrangement of FIG. 1.

A first example of the membrane reactor is illustrated in FIG. 2, in which oxygen permeates through the membrane for reaction with the hydrogen-containing gas within the gas stream. The membrane reactor comprises a casing 18 having an inlet 20 located in one side wall of the casing 18 for receiving the pumped gas stream from the secondary vacuum pump 10, and an outlet 22 located in another side wall of the casing 18 and from which the gas stream is expelled to the primary vacuum pump 12. An electrochemical membrane 24 protrudes partially into the casing 18 towards the inlet 20 so that the gas stream entering the casing 18 impinges upon the outer surface of the membrane 24. Vacuum seals 26 provide an air-tight seal between the casing 18 and the outer surface of the membrane 24.

The membrane 24 is in the form of a cylinder which is closed at the end 28 thereof located within the casing 18 and which is open at the end 30 thereof located outside the casing. The membrane 24 may be formed from an oxygen anion conductor, for example yttrium stabilised zirconium or gadolinium doped ceria.

A first electrode 32 is formed on the inner surface of the membrane 24 for exposure to a gaseous source of oxygen, in this example air, which is conveyed into the bore of the membrane 24 through the open end 30 thereof. A second electrode 34 is formed on the outer surface of the membrane 24 for exposure to the gas stream passing through the casing 18. The electrodes 32, 34 may be deposited using a technique such as vacuum sputtering or applying any suitable commercially available "ink" to the surface. In the event that one of the electrodes is formed on the surface of the membrane 24 using ink, the whole assembly must be fired in a suitable atmosphere determined by the nature of the ink.

The first electrode 32 is preferably formed from a material that is able to catalyse the dissociative adsorption of oxygen, such as platinum or other platinum group metal. The second electrode 34 is preferably formed from a material that is able to catalyse the oxidation of a hydrocarbon to carbon dioxide and water, and/or the oxidation of hydrogen to water. Again, suitable examples are platinum or other platinum group metal.

Depending on the nature of the material used to form the membrane 24, the membrane may require heating to raise its temperature above a critical temperature $T_c$ at which the membrane 24 is able to conduct the oxygen anions. In view of this, a heater 36 is located within the bore of the membrane 24 for heating the membrane 20 to the required temperature, which, depending again on the material used to form the membrane 24, may be at least 300° C. A heater controller may be provided for controlling the heater 36, for example in response to temperature signals received from a thermocouple located proximate the membrane 24. A low voltage power supply 38 may be connected by electrical contacts 40, 42 to the first and second electrodes 32, 34 respectively to enable a potential difference to be applied between the first and second electrodes 32, 34 and thus across the membrane 24.

In use, the inner surface of the membrane 24 is exposed to an oxygen source, conveniently air, and a potential difference is applied across the membrane 24 using the power supply 38. At the first electrode 32, oxygen within the air is reduced to form oxygen anions:

$$O_2+2V_o+4e^- \leftrightarrows 2O_o \quad (3)$$

where $V_o$ is a doubly charged oxygen anion vacancy and $O_o$ is a filled oxygen anion site in the membrane 24. When the temperature of the membrane 24 is above $T_c$, oxygen anions will permeate across the membrane 24 at a rate dependent, amongst other things, on the surface area of the electrodes 32, 34, the partial pressure of oxygen at the inner surface of the membrane 24 and the potential difference applied across the membrane 24. At the second electrode 34, the oxygen anions react with the hydrogen-containing gas within the gas stream according to equation (1) above.

A gas sensor may be located between the membrane reactor 16 and the primary vacuum pump 12 for detecting the amount of oxygen present within the gas stream downstream from membrane reactor 16. The sensor may output a signal to a controller depending on, say, the amount of oxygen contained within the gas stream. When there is no oxygen contained within this gas stream, this can be an indication of incomplete reduction of the hydrogen-containing gas within the membrane reactor 16, and so in response to the signal output from the sensor the controller may effect an increase the potential difference applied across the membrane 24 to in turn increase the rate at which the oxygen anions permeate across the membrane 24 until oxygen is detected within the gas stream.

The water vapour produced through the reaction between the oxygen anions and the hydrogen-containing gas may be condensed from the gas stream within a condenser located between the membrane reactor 16 and the primary vacuum pump 12. Alternatively, the primary vacuum pump 12 may have a pumping mechanism that exposes the gas stream to water and wherein the water vapour is condensed from the gas stream. Examples of a vacuum pump having such a pumping mechanism include a liquid ring pump and a liquid ejector pump.

Figure 3:
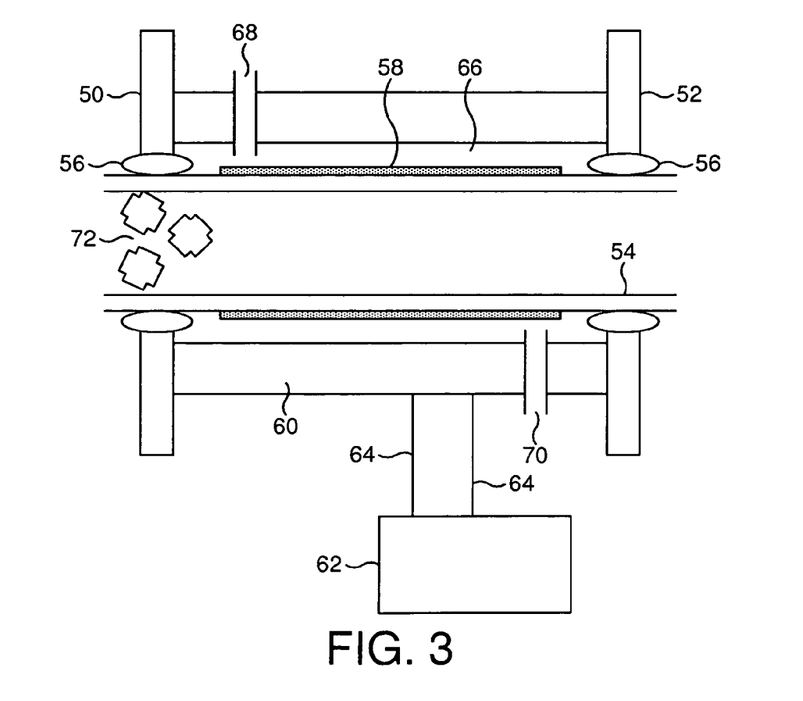
FIG. 3 illustrates another example of a membrane reactor for use in the pumping arrangement of FIG. 1.

A second example of the membrane reactor is illustrated in FIG. 3, in which hydrogen permeates through the membrane from one side thereof for reaction with a gas adsorbed on the other side of the membrane. The membrane reactor comprises a flanged inlet 50 for receiving the gas stream and a flanged outlet 52 through which the gas stream is expelled to the primary vacuum pump 12. The flanged inlet 50 may be connected directly to the exhaust of the secondary vacuum pump 10, or a conduit may be provided between the exhaust of the secondary vacuum pump 10 and the flanged inlet 50 for conveying the pumped gas stream therebetween. Similarly, the flanged outlet 52 may be connected directly to the inlet of the primary vacuum pump 12, or a conduit may be provided between the inlet of the primary vacuum pump 12 and the flanged outlet 52 for conveying the pumped gas stream therebetween.

A porous or nano-porous tube 54 extends between the flanged inlet 50 and flanged outlet 52, the tube 54 having a bore through which the pumped gas steam passes as it is conveyed from the secondary vacuum pump 10 to the primary vacuum pump 12. Vacuum seals 56 provide air tight seals between the tube 54 and the flanges. In this example, a layer of palladium is located on the outer surface of the tube 54 to provide a hydrogen permeable membrane 58.

Depending on the nature of the material used to form the membrane 58, the membrane may require heating to raise its temperature above a critical temperature $T_c$ at which the membrane 58 is able to conduct hydrogen ions. In view of this, the membrane reactor may comprise a heater 60 extending about the membrane 58 for heating the membrane 58 to the required temperature, which, depending again on the material used to form the membrane 58 may be at least 100° C. A heater controller 62 is connected to the heater 60 by electrical connectors 64 for controlling the heater 60.

The heater 60 is spaced from the outer surface of the membrane 58 to define an annular chamber 66 therebetween. A gas inlet 68 passes through the heater 60 towards one end thereof to enable a gas for reacting with hydrogen ions to enter the chamber 66. A gas outlet 70 is also provided in the heater 60 towards the other end thereof to enable the products of the reaction between this gas and the hydrogen ions to be expelled from the chamber 66. In this example, oxygen is used as the gas for reacting with the hydrogen ions, and so an air flow is established through the chamber 66 to convey oxygen into the chamber 66 and convey water vapour out from the chamber 66.

As illustrated in FIG. 3, one or more structures 72 are located in the bore of the tube 54 towards the inlet end thereof for creating turbulence in the gas stream passing through the membrane reactor 16. As a result, hydrogen ($H_2$) within the gas stream is directed into the pores of the tube 54 to impact upon the inner surface of the membrane 58, whereat the hydrogen dissociates to form hydrogen ions which are transported across the membrane 58 to react with oxygen adsorbed on the outer surface of the membrane to form water vapour according to equation (2) above. The equilibrium partial pressure at the outer surface of the membrane 58 will be determined by the reaction between the oxygen and hydrogen ions, and will be very low in comparison to the partial pressure of hydrogen at the inner surface of the membrane 58, and this acts to drive the hydrogen ions across the membrane 58.

In either of the above examples, for relatively high flow rates of hydrogen (several slm) or hydrocarbon (above 100 slm) within the gas stream, the number of membranes 24, 58 may be increased to increase the surface area of membrane exposed both to the hydrogen-containing gas and the oxygen source. For example, an array of cylindrical membranes may be arranged in series or in parallel for receiving the gas stream. Alternatively, a series of membranes may protrude into a housing through which the gas stream is being conveyed.

In either of the above examples, the heater may be omitted, and the air or other gaseous source of oxygen heated by a heating mechanism to a temperature above $T_c$ prior to delivery to the membrane, so that the temperature of the membrane is increased by heat transferred thereto from the air.

While the foregoing description and drawings represent various embodiments of the present invention, it will be apparent to those skilled in the art that various changes and modifications may be made therein without departing from the true spirit and scope of the present invention.

I claim:

1. A method of pumping a gas stream containing hydrogen comprising the steps of:
   conveying the gas stream through a vacuum pumping mechanism;
   subsequently conveying the gas stream at a sub-atmospheric pressure through a membrane reactor attached to an exhaust flange of the vacuum pump mechanism such that the gas stream is conveyed to a first side of a membrane permeable to oxygen ions within the membrane reactor wherein the first side of the membrane comprises a catalyst to catalyze the oxidation of a hydrocarbon or hydrogen in the gas stream; and
   exposing a second side of the membrane to a gaseous source of oxygen, wherein the second side of the membrane comprises a material to disassociate oxygen into oxygen ions so that the oxygen ions permeate across the membrane to react with the hydrocarbon or hydrogen in the gas stream thereby inhibiting hydrogen from back streaming through the pumping mechanism.

2. The method according to claim 1 wherein the pumping mechanism comprises a molecular pumping mechanism.

3. The method according to claim 2 wherein the pumping mechanism comprises a turbomolecular pumping mechanism.

4. The method according to claim 1 wherein the gas stream is conveyed to the first side of the membrane at a pressure less than 50 mbar absolute.

5. The method according to claim 1 wherein the gas stream is conveyed to the first side of the membrane at a pressure less than 10 mbar absolute.

6. A method of pumping a gas stream containing hydrogen comprising the steps of:
   conveying the gas stream through a vacuum pumping mechanism;
   subsequently conveying the gas stream at a sub-atmospheric pressure to a membrane reactor attached to an exhaust flange of the vacuum pump mechanism such that the gas stream comes in contact with a first side of an oxygen anion conducting membrane within the membrane reactor;
   exposing a second side of the membrane to a gaseous source of oxygen, so that oxygen from the oxygen source disassociates proximate the second side of the membrane to form oxygen ions that permeate across the membrane to react with hydrogen in the gas stream and thereby inhibiting hydrogen from back streaming through the pumping mechanism.

7. The method according to claim 6 wherein the membrane is heated to a temperature of at least 300° C.

8. The method according to claim 7 wherein a potential difference is applied across the membrane to promote permeation of oxygen ions across the membrane.

9. The method according to claim 8, wherein an inner surface of the membrane is exposed to the oxygen source, and an outer surface of the membrane is exposed to the gas stream.

10. A vacuum pumping arrangement for pumping a gas stream containing hydrogen, the arrangement comprising:
    a vacuum pumping mechanism receiving the gas stream and exhausting a pumped gas stream at a sub-atmospheric pressure;

a membrane reactor attached to an exhaust flange of the vacuum pumping mechanism, the reactor comprising a membrane permeable to oxygen ions, wherein the membrane has a first side for exposure to the pumped gas stream and a second side for exposure to a gaseous source of oxygen and wherein oxygen ions are formed through dissociation at the membrane and pass through the membrane and react with hydrogen in the pumped gas stream so as to remove hydrogen from the pumped gas stream.

11. The pumping arrangement according to claim 10 wherein the pumping mechanism comprises a molecular pumping mechanism.

12. The pumping arrangement according to claim 11 wherein the molecular pumping mechanism comprises a turbomolecular pumping mechanism.

13. The pumping arrangement according to claim 10 wherein the sub-atmospheric pressure is less than 50 mbar absolute.

14. The pumping arrangement according to claim 10 further comprising a second pumping mechanism located downstream from the membrane.

15. The method of claim 1 wherein the gas stream contains molecular hydrogen.

16. The method of claim 1 wherein when ions from one of the gas stream and the oxygen source permeate across the membrane to react with the other of the gas stream and the oxygen source, the reaction produces water.

17. The vacuum pumping arrangement of claim 10 wherein the gas stream contains molecular hydrogen.

18. The vacuum pumping arrangement of claim 10 wherein when BOO of hydrogen ions and oxygen ions pass through the membrane and react with the other of the hydrogen ions and the oxygen ions so as to remove hydrogen from the pumped gas stream, the reaction produces water.

* * * * *

UNITED STATES PATENT AND TRADEMARK OFFICE
CERTIFICATE OF CORRECTION

| | | |
|---|---|---|
| PATENT NO. | : 9,023,133 B2 | Page 1 of 1 |
| APPLICATION NO. | : 12/310742 | |
| DATED | : May 5, 2015 | |
| INVENTOR(S) | : Robert Bruce Grant | |

It is certified that error appears in the above-identified patent and that said Letters Patent is hereby corrected as shown below:

Claims

Claim 16:
Column 12, lines 6-7, delete "one of the gas stream and"
Column 12, lines 8-9, delete "other of the" and delete "and the oxygen source"

Claim 18:
Column 12, line 13, delete "BOO of hydrogen ions and"
Column 12, line 14, delete "other of the"
Column 12, lines 14-15, delete "ions and the oxygen ions"

Signed and Sealed this
Twenty-third Day of February, 2016

Michelle K. Lee
*Director of the United States Patent and Trademark Office*